US010459499B2

United States Patent
Shabbir et al.

(10) Patent No.: US 10,459,499 B2
(45) Date of Patent: Oct. 29, 2019

(54) SYSTEMS AND METHODS FOR MANAGEMENT OF LIQUID COOLING UPGRADES WITH LIQUID COOLING ADAPTER CARD

(71) Applicant: Dell Products L.P., Round Rock, TX (US)

(72) Inventors: Hasnain Shabbir, Round Rock, TX (US); Dominick A. Lovicott, Jarrell, TX (US)

(73) Assignee: Dell Products L.P., Round Rock, TX (US)

( * ) Notice: Subject to any disclaimer, the term of this patent is extended or adjusted under 35 U.S.C. 154(b) by 131 days.

(21) Appl. No.: 15/607,088

(22) Filed: May 26, 2017

(65) Prior Publication Data

US 2018/0341301 A1    Nov. 29, 2018

(51) Int. Cl.
*G06F 1/20* (2006.01)
*H01L 23/473* (2006.01)
*H05K 7/20* (2006.01)

(52) U.S. Cl.
CPC ............... *G06F 1/206* (2013.01); *G06F 1/20* (2013.01); *H05K 7/20772* (2013.01); *H05K 7/20836* (2013.01); *G06F 2200/201* (2013.01)

(58) Field of Classification Search
CPC . G06F 1/206; G06F 2200/201; H01L 23/473; F28D 15/06; F28F 2250/08; G11B 33/128; G11B 33/142; G11B 33/144; H05K 7/1487; H05K 7/1489; H05K 7/1492

See application file for complete search history.

(56) References Cited

U.S. PATENT DOCUMENTS

| 4,967,832 A * | 11/1990 | Porter ................. H01L 23/4735 |
| | | 165/104.32 |
| 7,011,143 B2 * | 3/2006 | Corrado .................... G06F 1/20 |
| | | 165/104.33 |
| 8,201,266 B2 * | 6/2012 | Campbell .............. G08B 13/19 |
| | | 361/754 |

(Continued)

OTHER PUBLICATIONS

Thermaltake, Tide Water All in one VGA Liquid Cooling Module, https://web.archive.org/web/20051018223829/http://www.thermaltake.com:80/watercooling/cl-w0052TideWater/cl-w0052.htm, obtained from Internet Mar. 15, 2018.

*Primary Examiner* — James Wu
*Assistant Examiner* — Michael A Matey
(74) *Attorney, Agent, or Firm* — Jackson Walker L.L.P.

(57) ABSTRACT

In accordance with these and other embodiments of the present disclosure, an information handling system may include a plurality of information handling resources including a thermal manager and a liquid cooling adapter comprising fluidic conduits for conveying a refrigerant liquid between a cooling distribution unit external to the information handling system and at least one of the plurality of information handling resources, a computer-readable medium configured to store information regarding the liquid cooling adapter, and a sideband interface communicatively coupled between the computer-readable medium and the thermal manager such that the thermal manager receives the information regarding the liquid cooling adapter from the computer-readable medium and provides thermal control of the information handling system in accordance with the information regarding the liquid cooling adapter.

20 Claims, 9 Drawing Sheets

(56) References Cited

U.S. PATENT DOCUMENTS

| | | | |
|---|---|---|---|
| 9,215,832 B2* | 12/2015 | Chang | H05K 7/20781 |
| 9,414,525 B2* | 8/2016 | Campbell | H05K 7/2039 |
| 9,516,791 B2* | 12/2016 | Chester | H05K 7/20772 |
| 10,331,144 B2* | 6/2019 | Shelnutt | G05D 7/0629 |
| 2003/0016498 A1* | 1/2003 | Kurokawa | H05K 7/20254 |
| | | | 361/699 |
| 2004/0008483 A1* | 1/2004 | Cheon | G06F 1/20 |
| | | | 361/679.53 |
| 2005/0065584 A1* | 3/2005 | Schiff | A61F 7/12 |
| | | | 607/105 |
| 2006/0187638 A1 | 8/2006 | Vinson et al. | |
| 2007/0064394 A1* | 3/2007 | Chen | H01L 23/473 |
| | | | 361/699 |
| 2007/0133171 A1* | 6/2007 | Cheon | H05K 7/20636 |
| | | | 361/699 |
| 2007/0209782 A1* | 9/2007 | Wyatt | F28D 15/0266 |
| | | | 165/76 |
| 2011/0226446 A1* | 9/2011 | Davis | G06F 1/20 |
| | | | 165/104.11 |
| 2012/0123595 A1* | 5/2012 | Bower, III | G05D 23/1934 |
| | | | 700/282 |
| 2013/0094139 A1* | 4/2013 | Campbell | H05K 7/20627 |
| | | | 361/679.47 |
| 2013/0205822 A1* | 8/2013 | Heiland | H05K 7/2079 |
| | | | 62/259.2 |
| 2014/0153607 A1* | 6/2014 | Chainer | G01K 7/427 |
| | | | 374/1 |
| 2015/0271908 A1* | 9/2015 | Arora | H05K 7/20336 |
| | | | 361/679.52 |
| 2016/0273996 A1* | 9/2016 | Alshinnawi | H05K 7/20272 |
| 2016/0381838 A1* | 12/2016 | Nakanishi | H05K 7/20809 |
| | | | 361/679.53 |
| 2017/0127575 A1* | 5/2017 | Lunsman | F16L 37/12 |
| 2018/0192553 A1* | 7/2018 | Huang | H05K 7/20809 |
| 2018/0279510 A1* | 9/2018 | Johnson | H05K 7/20781 |

* cited by examiner

| ENERGY BALANCE TABLE ||||||| |
|---|---|---|---|---|---|---|
| ENERGY BALANCE NUMBER | DESCRIPTION | CONFIGURATION MATCH | PWM TO? (CFM/LFM) | EXHAUST SENSOR? (T_EXHAUST OR PCIe_INLET) | CROSS-SECTIONAL AREA FOR LFM CALCULATION [IN FT²] | SYSTEM AIRFLOW AND EXHAUST REPORTING |
| EB1 | REPORT SYSTEM AIRFLOW - 24 DRIVE NP | 1,2,3,4 | CFM | T_EXHAUST | | X |
| EB2 | REPORT SYSTEM AIRFLOW - 12 DRIVE NP | 5,6,7 | CFM | T_EXHAUST | | X |
| EB3 | X4 PCI COOLING | 15 | LFM | T_EXHAUST | 0.133 | |
| EB4 | X8 PCI COOLING | 16 | LFM | T_EXHAUST | 0.133 | |
| ○ ○ ○ | ○ ○ ○ | ○ ○ ○ | ○ ○ ○ | ○ ○ ○ | ○ ○ ○ | ○ ○ ○ |

FIG. 4

| LFM CORRELATIONS ARE DEFINED HERE AND ARE BASED ON WORST CASE SLOT LFM. THE CALCULATED LFM FROM HERE IS THEN TRANSLATED TO PER-SLOT LFM BASED ON PER-SLOT SCALING FACTORS ||||||||
|---|---|---|---|---|---|---|---|
| LFM = LFM$_{BASE}$ × (1 + SF × COMPONENTCOUNT) × ... <br> LFM$_{BASE}$ = A × PWM$^5$ + B × PWM$^4$ + C × PWM$^3$ + D × PWM$^2$ + E × PWM + F <br> FAN SPEED (% PWM) IS AN AVERAGE OF ALL FAN ZONES ||||||||
| PWM-TO-CFM CORRELATION (5TH ORDER POLYNOMIAL) || MEMORY COUNT | SCALING FACTORS (SF) | 0 |
| ^ || CPU COUNT | ^ | 0 |
| ^ || PCIe COUNT | ^ | 0 |
| ^ || HDD COUNT | ^ | -0.006 |
| ^ || FAN COUNT | ^ | 0 |
| ^ || LOWER LFM LIMIT | UCL | |
| ^ || LOWER LFM LIMIT | LCL | |
| A | B | C | D | E | F | | |
| | | | 8.3 | 154 | 11 | | |

FIG. 5B

SYSTEMS AND METHODS FOR MANAGEMENT OF LIQUID COOLING UPGRADES WITH LIQUID COOLING ADAPTER CARD

TECHNICAL FIELD

The present disclosure relates in general to information handling systems, and more particularly to thermal management of an information handling system having liquid cooling.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, thermal management systems including air movers (e.g., cooling fans and blowers) have often been used in information handling systems to cool information handling systems and their components. Various input parameters to a thermal management system, such as measurements from temperature sensors and inventories of information handling system components are often utilized by thermal management systems to control air movers and/or throttle power consumption of components in order to provide adequate cooling of components.

As an improvement over traditional fan-based cooling systems, some information handling system manufacturers have provided mechanisms to cool individual component information handling resources with liquid, such as water or another refrigerant. Due to liquid cooling solutions not being tremendously prevalent as of yet, and a desire to reduce complexity in system design, systems which allow simple upgrades of an existing system to liquid cooling may be desirable. However, addition of liquid cooling may require modifications to thermal control settings, and using traditional approaches, may require personalized customizations to thermal control settings in order to take advantage of a liquid cooling solution, thus adding design complexity. In addition, adding functionality to a motherboard for liquid cooling detection, leak detection and other possible liquid cooling control and telemetry may be prohibitively expensive.

SUMMARY

In accordance with the teachings of the present disclosure, disadvantages and problems associated with thermal management of an information handling system may be reduced or eliminated.

In accordance with these and other embodiments of the present disclosure, an information handling system may include a plurality of information handling resources including a thermal manager and a liquid cooling adapter comprising fluidic conduits for conveying a refrigerant liquid between a cooling distribution unit external to the information handling system and at least one of the plurality of information handling resources, a computer-readable medium configured to store information regarding the liquid cooling adapter, and a sideband interface communicatively coupled between the computer-readable medium and the thermal manager such that the thermal manager receives the information regarding the liquid cooling adapter from the computer-readable medium and provides thermal control of the information handling system in accordance with the information regarding the liquid cooling adapter.

In accordance with these and other embodiments of the present disclosure, a liquid cooling adapter may include fluidic conduits for conveying a refrigerant liquid between a cooling distribution unit external to an information handling system comprising the liquid cooling adapter and at least one information handling resource of the information handling system, a computer-readable medium configured to store information regarding the liquid cooling adapter, and a sideband interface configured to be communicatively coupled between the computer-readable medium and a thermal manager of the information handling system such that the thermal manager receives the information regarding the liquid cooling adapter from the computer-readable medium and provides thermal control of the information handling system in accordance with the information regarding the liquid cooling adapter.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4 illustrates a user interface for managing thermal conditions of a server information handling system with stored configuration settings of subsystems within the information handling system, in accordance with embodiments of the present disclosure;

FIGS. 5A and 5B illustrate a user interface for estimating system airflow and exhaust temperature based upon conservation of energy within an information handling system housing, in accordance with embodiments of the present disclosure;

DETAILED DESCRIPTION

Preferred embodiments and their advantages are best understood by reference to FIGS. 1 through 8, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
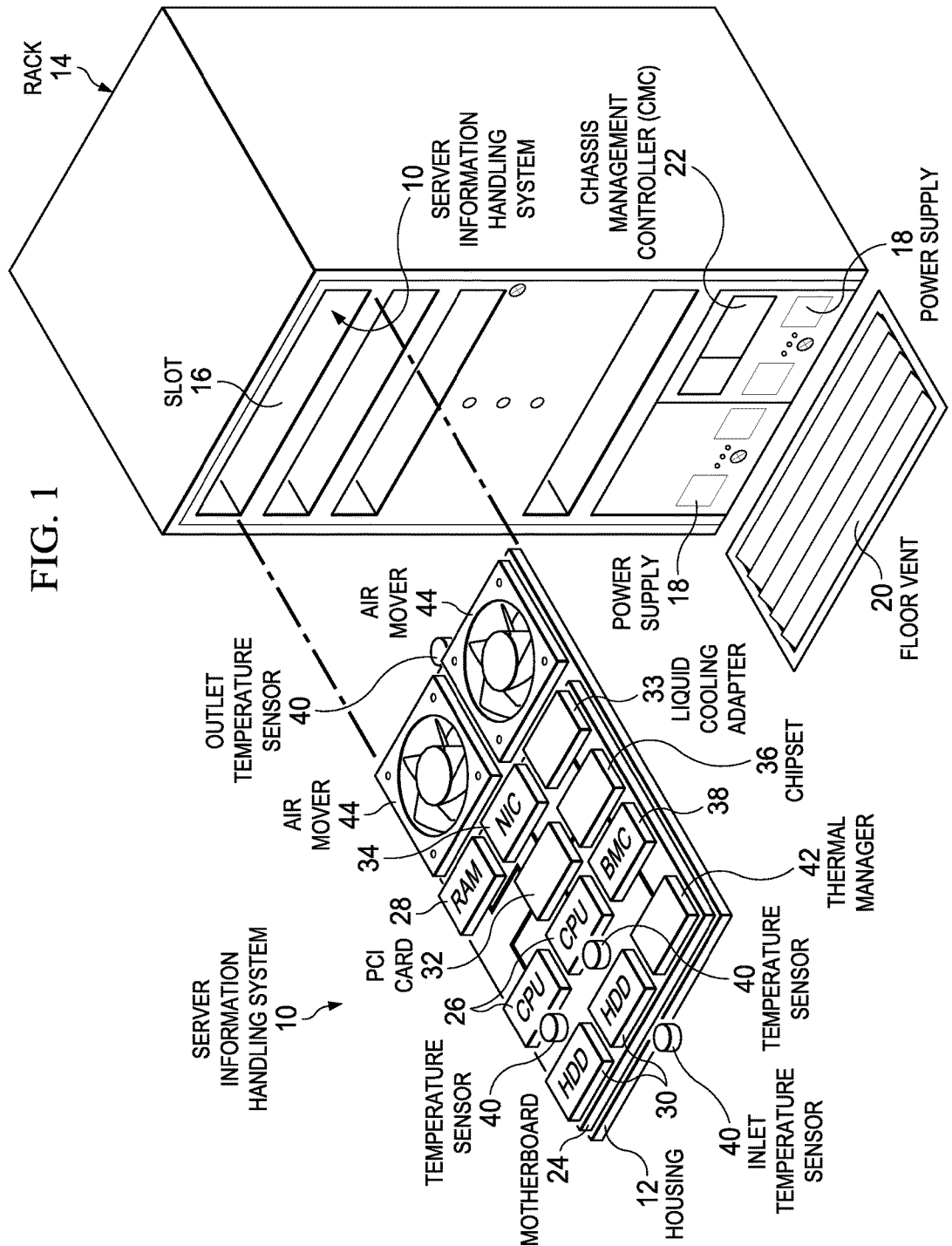
FIG. 1 illustrates a perspective view of an example information handling system, in accordance with embodiments of the present disclosure.

FIG. 1 illustrates a perspective view of an example information handling system 10, in accordance with embodiments of the present disclosure. As shown in FIG. 1, information handling system 10 may comprise a server built into a housing 12 that resides with one or more other information handling systems 10 in a rack 14. Rack 14 may comprise a plurality of vertically-stacked slots 16 that accept information handling systems 10 and a plurality of power supplies 18 that provide electrical energy to information handling systems 10. In a data center environment, rack 14 may receive pretreated cooling air provided from a floor vent 20 to aid removal of thermal energy from information handling systems 10 disposed in rack 14. Power supplies 18 may be assigned power based upon availability at the data center and may allocate power to individual information handling systems 10 under the management of a chassis management controller (CMC) 22. CMC 22 may aid coordination of operating settings so that information handling systems 10 do not exceed thermal or power usage constraints.

Housing 12 may include a motherboard 24 that provides structural support and electrical signal communication for processing components disposed in housing 12 that cooperate to process information. For example, one or more central processing units (CPUs) 26 may execute instructions stored in random access memory (RAM) 28 to process information, such as responses to server requests by client information handling systems remote from information handling system 10. One or more persistent storage devices, such as hard disk drives (HDD) 30 may store information maintained for extended periods and during power off states. A backplane communications manager, such as a PCI card 32, may interface processing components to communicate processed information, such as communications between CPUs 26 and one or more network interface cards (NICs) 34 that are sent through a network, such as a local area network. A chipset 36 may include various processing and firmware resources for coordinating the interactions of processing components, such as a basic input/output system (BIOS). A baseboard management controller (BMC) 38 may interface with chipset 36 to provide out-of-band management functions, such as remote power up, remote power down, firmware updates, and power management. For example, BMC 38 may receive an allocation of power from CMC 22 and monitor operations of the processing components of information handling system 10 to ensure that power consumption does not exceed the allocation. As another example, BMC 38 may receive temperatures sensed by temperature sensors 40 and apply the temperatures to ensure that thermal constraints are not exceeded.

A thermal manager 42 may execute as firmware, software, or other executable code on BMC 38 to manage thermal conditions within housing 12, such as the thermal state at particular processing components or ambient temperatures at discrete locations associated with housing 12. Thermal manager 42 may control the speed at which air movers 44

(e.g., cooling fans or cooling blowers) rotate to adjust a cooling airflow rate in housing 12 so that heat is removed at an appropriate temperature, so as to reduce overheating of a CPU 26 or prevent an excessive exhaust temperature as measured by an outlet temperature sensor 40. In the event that air movers 44 cannot provide sufficient cooling airflow to meet a thermal constraint, thermal manager 42 may reduce power consumption at one or more of the processing components to reduce the amount of thermal energy released into housing 12, such as by throttling the clock speed of one or more of CPUs 26. Thermal manager 42 may respond to extreme thermal conditions that place system integrity in jeopardy by shutting down information handling system 10, such as might happen if floor vent 20 fails to provide treated air due to a data center cooling system failure.

In order to more effectively manage thermal conditions associated with housing 12, thermal manager 42 may apply conservation of energy to estimate thermal conditions at discrete locations associated within housing 12 and then use the estimated thermal conditions for more precise control of the overall thermal state of information handling system 10. For example, thermal manager 42 may perform one or more energy balances based upon available measures of power consumption, cooling fan speed, and sensed thermal conditions to estimate intermediate temperatures at discrete locations within housing 12. The estimated intermediate temperatures may provide more precise control of the thermal conditions at discrete locations to maintain thermal constraints, such as maximum ambient temperatures of components that do not include temperature sensors or maximum inlet temperatures for components downstream in the cooling airflow from the estimated ambient temperature. Estimated intermediate temperatures may be applied in an overall system conservation of energy model so that fan speed and component power consumption are determined to maintain thermal constraints, such as maximum exhaust temperatures. Thermal manager 42 may estimate discrete thermal conditions at locations within housing 12 by applying available component configuration information, such as a component inventory kept by BMC 38, and sensed, known, or estimated power consumption of the components. For example, BMC 38 may use actual power consumption of components or subassemblies if actual power consumption is available, known power consumption stored in the BMC inventory for known components, or estimated power consumption based upon the type of component and the component's own configuration. An example of estimated power consumption is a general estimate of power consumption stored in BMC 38 for unknown PCI cards 32 with the general estimate based upon the width of the PCI card, i.e., the number of links supported by the PCI card. In one embodiment, as estimated intermediate thermal conditions are applied to generate fan and power consumption settings, a self-learning function may compare expected results and models to component and subassembly thermal characteristics so that more accurate estimates are provided over time.

Figure 8:
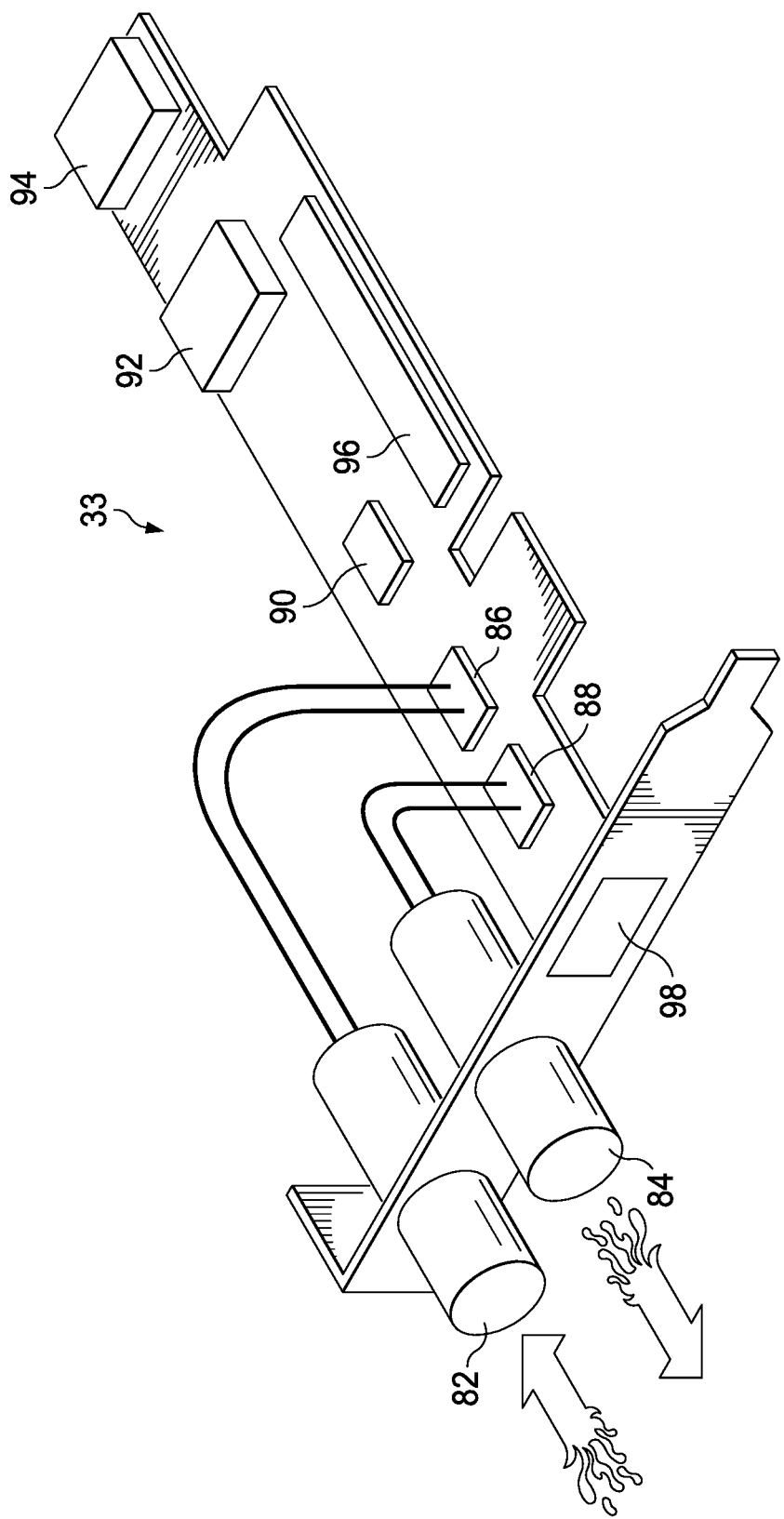
FIG. 8 illustrates a perspective view of an example liquid cooling adapter, in accordance with embodiments of the present disclosure.

As shown in FIG. 1, an information handling system 10 may also include a liquid cooling adapter 33. Liquid cooling adapter 33 may comprise any suitable adapter card (e.g., a PCIe card) configured to communicatively and removably couple to motherboard 24 and fluidically couple to a cooling distribution unit external to information handling system 10 in order to receive a refrigerant liquid and return heated refrigerant liquid to the cooling distribution unit. Also, although not shown in FIG. 1 for descriptive clarity, liquid cooling adapter 33 may include fluidic conduits for conveying refrigerant liquid to components of information handling system 10 and/or rack 14, and in addition, although not shown in FIG. 1 for descriptive clarity, information handling system 10 and/or rack 14 may include corresponding fluidic conduits as well as heat exchangers (e.g., cold plates, heat sinks, etc.) thermally coupled to components (e.g., CPUs 26, power supplies 18, etc.) of information handling system 10 and/or rack 14 and configured to transfer heat from such components to the refrigerant liquid in order to cool such components. Additional detail regarding liquid cooling adapter 33 is shown in FIG. 8.

Figure 2:
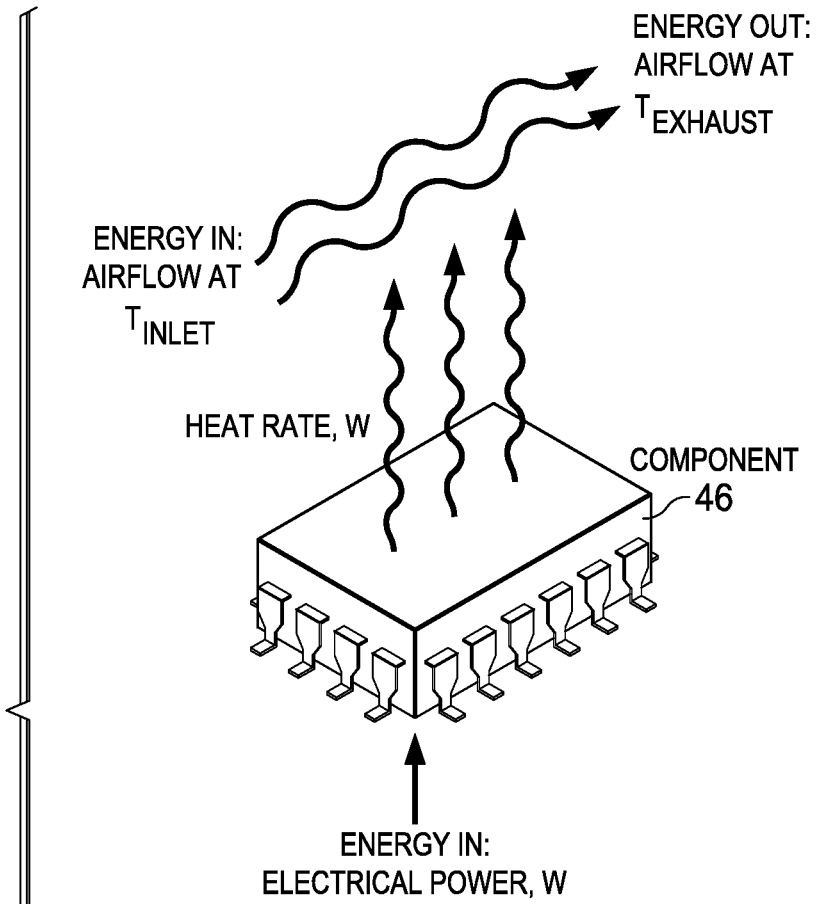
FIG. 2 illustrates a mathematical model for estimating component thermal performance and setting thermal controls, in accordance with embodiments of the present disclosure.

FIG. 2 illustrates a mathematical model for estimating component 46 thermal performance and setting thermal controls, in accordance with embodiments of the present disclosure. According to the law of conservation of energy, the total energy state of an information handling system is maintained as a balance of the energy into the system and the energy out of the system. The energy balance may be broken into a sum of a plurality of components 46 wherein each component 46 has a known or estimated power consumption that introduces thermal energy into the information handling system. The system energy balance becomes the energy into the system as reflected by an airflow inlet temperature, the thermal energy released by the sum of the components 46 that consume power in the system and the energy out of the system as reflected by an airflow exhaust temperature. Energy removed from the system may relate to the mass flow rate of air flowing through the system and the coefficient for energy absorption of the cooling airflow. Simplified for the coefficient that typically applies to atmospheric air, the energy released by electrical power consumption may be equal to airflow in cubic feet per minute divided by a constant of 1.76 and multiplied by the difference between the exhaust temperature and inlet temperature. Alternatively, again simplified for the coefficient that typically applies to atmospheric air, the energy released by electrical power consumption may be equal to a linear airflow velocity in linear feet per minute (which may be calculated as a cubic airflow rate in cubic feet per minute multiplied by an area of an inlet of a component of interest (e.g., cross sectional area of inlet of a card)) divided by a constant of 1.76 and multiplied by the difference between the exhaust temperature and inlet temperature. Thermal manager 42 may apply one or both of these formulas to set cooling fan speed to meet exhaust temperature constraints. For internal components and subassemblies, thermal manager 42 may determine a minimum fan speed to keep ambient temperature of a component within a desired constraint by determining an "inlet" temperature estimated for air as it arrives at the component based upon power consumption of other components in the airflow before the air arrives at the component of interest. The increase in temperature exhausted at the component of interest may be estimated based upon the power consumed by the component of interest and the cooling airflow rate. Thus, a fan speed may be set that prevents an "exhaust" from the component of interest that is in excess of thermal constraints associated with the component. Alternatively, estimated temperatures at intermediate components may be summed and applied to set a fan speed that achieves a desired overall system thermal condition, such as an exhaust temperature constraint.

Applying conservation of energy and component power consumption to manage thermal conditions may allow more precise control of thermal conditions and discrete control within an information handling system housing even where measurements of actual thermal conditions by a temperature sensor are not available. A modular energy balance thermal controller may allow combined serial energy balances to account for the effect of reduced inlet temperatures when increasing speeds for downstream energy balances. This flexibility may be provided by using energy balances independently to solve for either exhaust temperature or airflow on a system-wide basis or at discrete locations within a system. Subsystem power consumption based upon a component or collection of components may allow for estimation of upstream preheat for other components within an information handling system housing. For example, components that do not dissipate substantial heat by power consumption may be scaled to have a reduced impact on airflow temperatures. One example of such a component is a cooling fan, which dissipates 60 to 80% of power consumption as heat and 20 to 40% as air moving, but is generally ignored with conventional thermal controls. By adding fan power and scaling to match efficiency for the system, a more precise picture of thermal conditions within a housing may be provided. Isolating power consumption of specific regions, subsystems or components of interest, such as PCI cards, may allow the power readings for the subsystems to include static power from non-relevant components that are accounted for by subtracting a static power value. Assigning scaled values that relate heat dissipation and power consumption for each subsystem may provide more exact estimates of thermal conditions and more precise control of airflow and power settings based upon preheat that occurs in the airflow as the airflow passes through the housing. Approaching thermal management based upon a serial summation of subsystem thermal conditions supports the use of static values for selected subsystems to subtract thermal overhead or exclude dynamic readings, such as to control fan speed to achieve a static reading instead of monitoring an available dynamic reading.

Using subsystem thermal condition estimates may aid in achieving more accurate fan speed settings for a desired exhaust constraint since airflow-to-fan speed relationships are set based on actual system configuration and component power consumption. Summed energy balances of discrete subsystems disposed in a housing may differentiate thermal control based on hardware inventory, system state, or system events to enhance control accuracy. Airflow may be scaled to account for component count based upon active components and functions being performed at the components during control time periods. When solving for airflow settings needed to meet a component or system-wide thermal constraint, the inlet or exhaust temperature may generally be a fixed requirement that aligns with a temperature limit so that selectively setting static values allows derivation of control values without using available dynamic values. Dynamically calculated inlet ambient with a fixed static exhaust ambient or a fixed inlet ambient and a dynamically calculated exhaust ambient may provide a better estimate of system airflow. As power use fluctuates, feedback and feed forward control of thermal conditions based on average power consumption may dampen cooling fan setting fluctuations that occur when fan settings are made based upon instantaneous power readings alone. Averaging measured fan speeds may also help to simplify correlations and to "learn" thermal characteristics of subsystems as thermal conditions respond over time to changes in power consumption at various subsystems. For example, each fan within a housing can run at different pulse width modulation (PWM) speed settings in which a speed of a fan is based on a duty cycle of a PWM signal received by the fan. Calculating an average PWM from individual fan PWM speed settings may allow a PWM duty cycle to airflow relationship. During operating conditions that have limited availability of dynamically sensed thermal conditions, such as at startup, during fan failure, during sensor failure, and during baseline cooling, estimated subsystem thermal conditions based upon subsystem power consumption may provide a model for fan speed settings. Generally, fan speed setting control based upon a summation of estimated and/or actual subsystem thermal conditions may allow defined minimum fan speeds for a system-wide constraint with supplemental cooling of critical components based on closed loop feedback.

Figure 3:
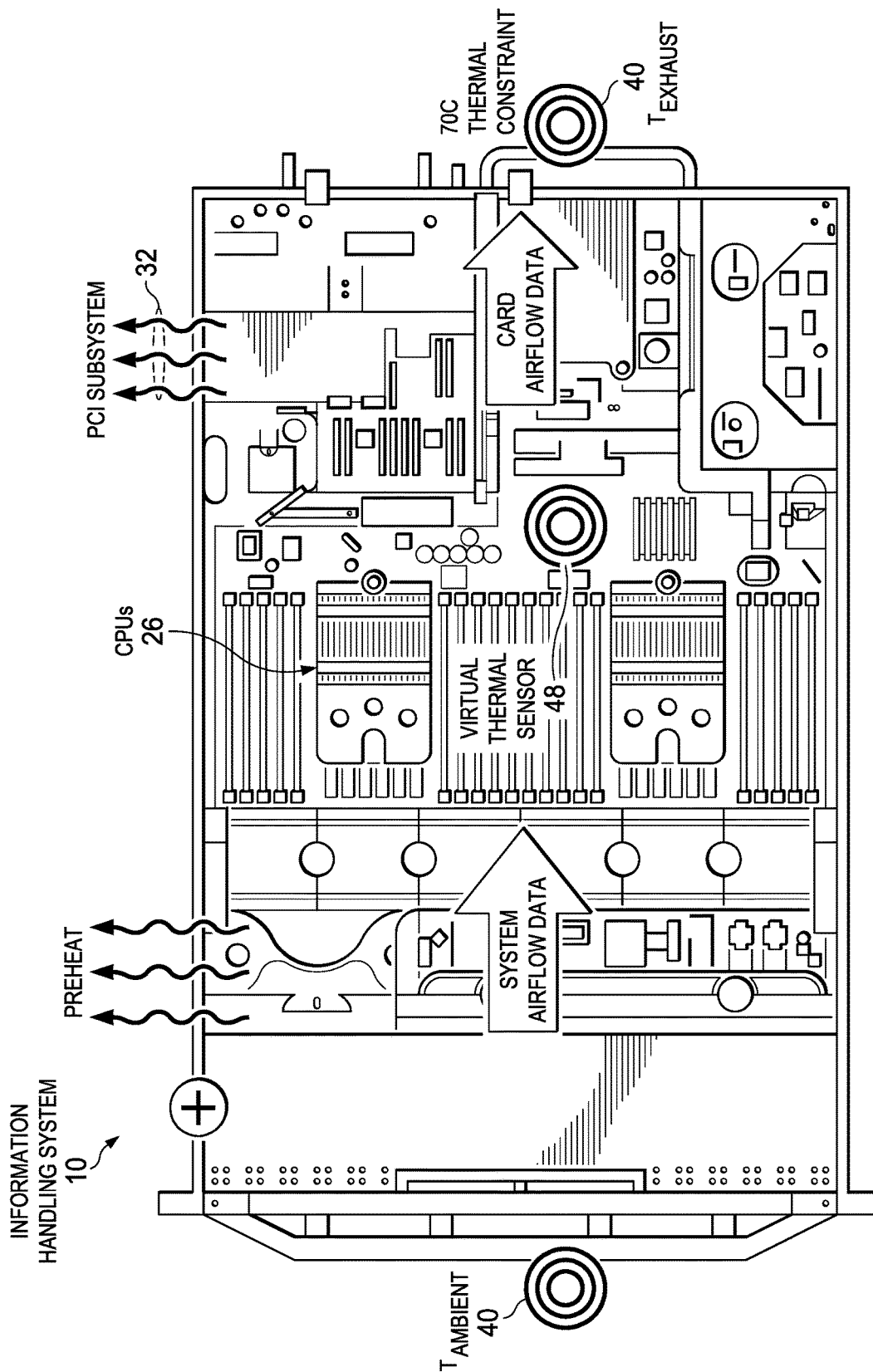
FIG. 3 illustrates a plan view of an example information handling system, in accordance with embodiments of the present disclosure.

FIG. 3 illustrates a plan view of example information handling system 10, in accordance with embodiments of the present disclosure. External air drawn into information handling system 10 may have an ambient temperature ($T_{AMBIENT}$) measured by an inlet temperature sensor 40 and an airflow rate determined by the speed at which one or more cooling fans spin. As the cooling airflow passes through housing 12, it may absorb thermal energy resulting in a preheat of the airflow for downstream components. The cooling airflow may be forced from information handling system 10 at an exhaust with an exhaust temperature ($T_{EXHAUST}$) fixed at thermal constraint (e.g., 70° C.) as a requirement and/or measured by an exhaust temperature sensor 40. Thermal manager 42 may adapt cooling fan speed so that the cooling airflow temperature $T_{EXHAUST}$ maintains a thermal constraint (e.g., 70° C.)

As shown in FIG. 3, a virtual thermal sensor 48 may be generated by thermal manager 42 at a location in information handling system 10 that receives preheated airflow, such as airflow that has passed by CPUs 26. Thermal manager 42 may apply configuration information stored in BMC 38 to determine the components that preheat airflow to virtual thermal sensor 48 and may determine power consumed by the components to arrive at a virtual temperature measured by virtual thermal sensor 48. For example, thermal manager 42 may apply power consumed by CPUs 26 and static power consumption associated with other preheat components to determine by conservation of energy the ambient temperature of air exhausted from CPUs 26 to arrive at the virtual temperature. The virtual temperature may then be used as an inlet temperature to a PCI card subsystem 32 so that an ambient temperature of PCI card subsystem 32 is computed based upon energy consumed by PCI card subsystem 32. PCI card subsystem 32 may exhaust air at temperature $T_{EXHAUST}$ measured by exhaust sensor 40 so that control of the ambient temperature within PCI card subsystem 32 provides control of the overall system exhaust. The increase in thermal energy caused by PCI card subsystem 32 as reflected by the increase from the virtual temperature to the exhaust temperature may be estimated using conservation of energy applied to the energy consumption of PCI card subsystem 32. Generally, PCI card subsystem 32 power consumption may be measured directly based upon power assigned by a power subsystem or estimated with a static value. Alternatively, power consumption may be derived from estimates using conservation of energy applied to known power consumption and thermal conditions in housing 12. Thus, the power consumed by PCI card subsystem 32 may be dynamically determined by actual measurements of power usage, by stored power usage based on the inventory of the PCI card maintained in the BMC, or by an estimate of power consumption based upon characteristics of the PCI card, such as the width of the PCI card.

Having one or more intermediate virtual thermal sensors 48 may provide flexibility in managing system operation by using a virtual temperature measurement as a dynamic thermal control input or a static thermal control constraint. For example, if PCI card subsystem 32 is controlled to have a static value of 50° C., then fan speed and CPU power consumptions may be adjusted to maintain that value. If $T_{EXHAUST}$ has a constraint of 70° C., then excessive temperatures might occur during low CPU power usage due to low fan speed settings needed to maintain the 50° C. virtual thermal sensor 48 measurement and temperature increases of greater than 20° C. from PCI card power consumption. In such an instance, if precise power control is available for desired components, thermal control might focus on $T_{EXHAUST}$ so that the virtual temperature falls below 50° C. or might focus on power consumption by PCI card subsystem 32 so that less thermal energy is released after virtual thermal sensor 48. Typically, PCI card subsystems do not at this time allow control of thermal energy release, such as by throttling a processor clock, however, such capabilities may be introduced for PCI cards or other components in the future. Discrete control of thermal conditions at different locations within information handling system 10 may be provided by generating virtual thermal sensors at the desired locations and then selectively treating the values as dynamic or static for control purposes.

FIG. 4 illustrates a user interface for managing thermal conditions of a server information handling system with stored configuration settings of subsystems within the information handling system, in accordance with embodiments of the present disclosure. Energy balance table 50 may include energy balance parameters for components integral to information handling system 10 as well as estimated values for potential replacement components, such as non-specific PCI cards having a width of four or eight lanes. By including configuration match information that relates components to energy consumption, thermal manager 42 may be able to estimate a thermal condition based on detected components and energy balance information associated with such detected components as set forth in energy balance table 50.

Figure 5A:
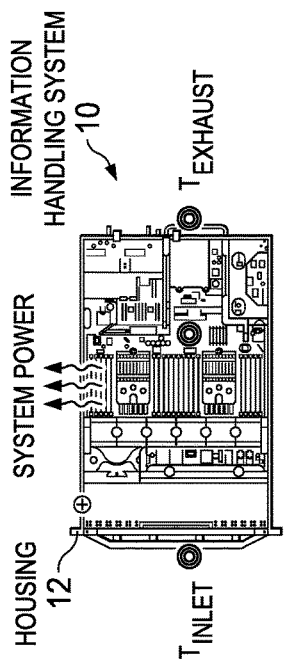

FIGS. 5A and 5B illustrate a user interface for estimating system airflow and exhaust temperature based upon conservation of energy within an information handling system housing, in accordance with embodiments of the present disclosure. An exhaust temperature energy balance table 52 may apply power, cubic airflow, linear airflow velocity, and sensed temperature values to estimate thermal states and set control for desired cubic airflow, linear airflow velocity, and temperature parameters. A power window 54 may depict a power dissipation calculation performed for each subsystem having an energy balance number in energy balance table 50. A total system power dissipation may represent power use by all desired components, which in this example embodiment may include one or more cooling fans. Scaling factors may be set to adjust the relative power consumption in various configuration modes in response to dynamic power settings. A static power setting may also allow control to achieve a desired power setting at a component. A cubic airflow window 56 depicts a mass flow calculation in cubic feet per minute (CFM) and a linear airflow velocity window 57 depicts a linear airflow velocity in linear feet per minute (LFM) for determination of cubic airflow or linear airflow velocity to achieve the energy balance with the determined power settings for each component. The example embodiment depicted by FIG. 5A and 5B may estimate cubic airflow, linear airflow velocity, and exhaust temperatures, including with virtual temperature sensors. In particular, for a given PWM value associated with cooling fans, exhaust temperature energy balance table 52 may correlate such PWM value to an estimated cubic airflow (e.g., in CFM) and/or an estimated linear airflow velocity (e.g., in LFM) for configurations associated with the energy balance number.

Figure 7:
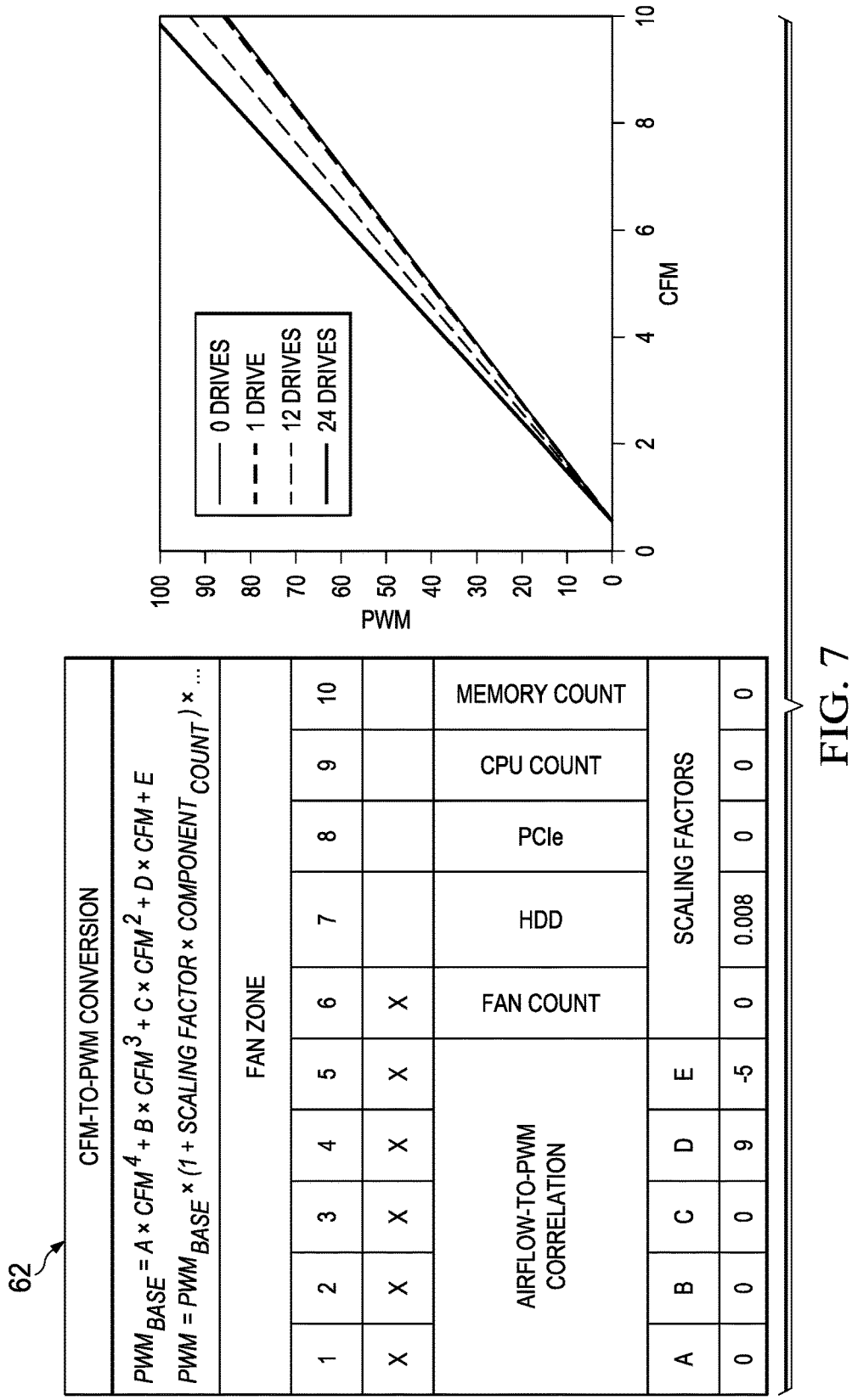
FIG. 7 illustrates a conversion of determined airflow rates to cooling fan pulse width modulation settings, in accordance with embodiments of the present disclosure.

Although FIG. 5B shows estimation of linear airflow velocity based on correlation from PWM values, in some embodiments, linear airflow velocity may be determined from the PWM-to-cubic airflow rate correlation, by dividing the cubic airflow rate correlated to a PWM value by an inlet area of a component of interest (e.g., card). FIG. 7 described below may provide mass airflows converted to cooling fan PWM values to assign cooling fan rotation speeds based upon individual component configurations adjusted for scaling.

Figure 6:
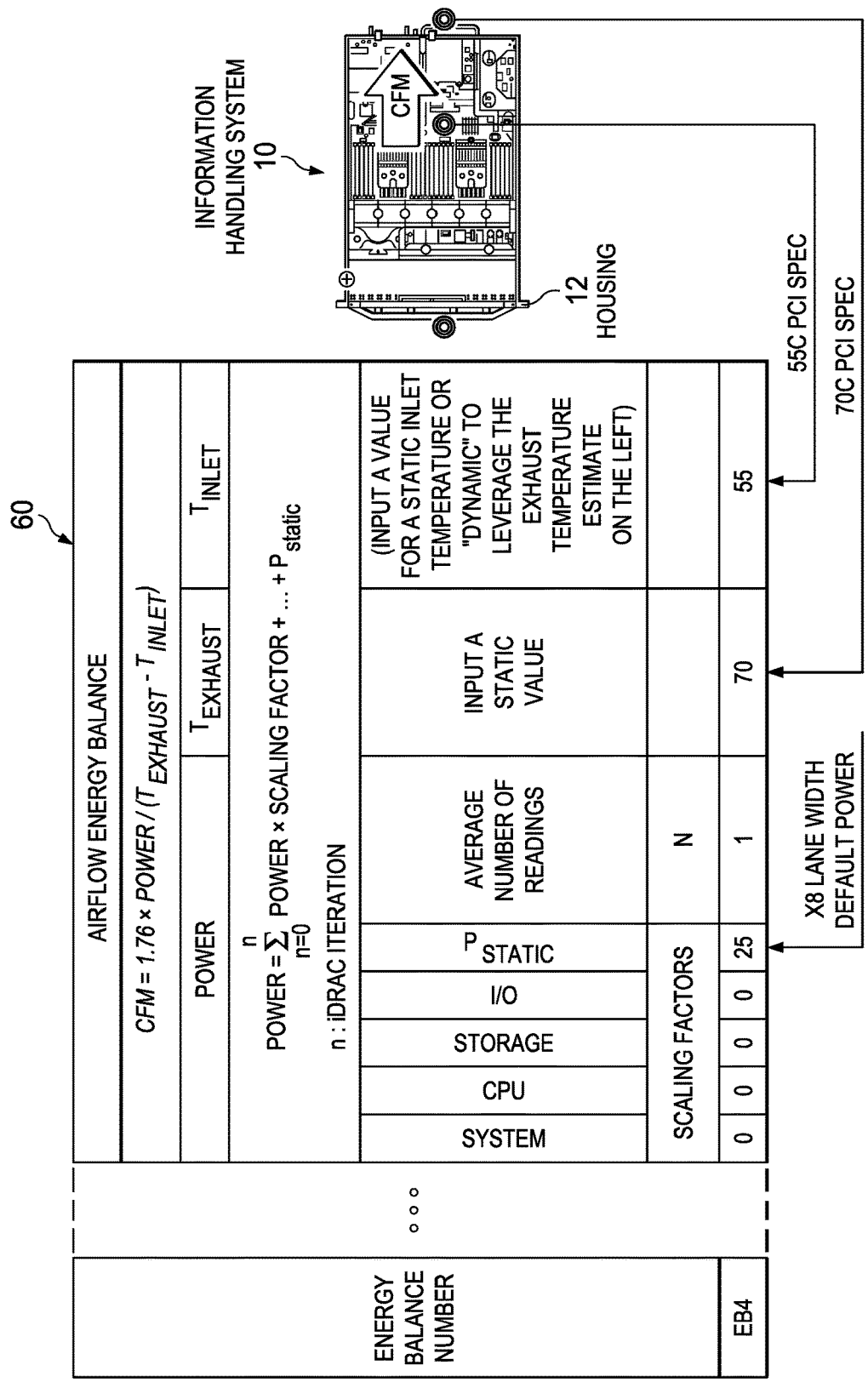
FIG. 6 illustrates a user interface for setting cooling airflow to meet defined conditions, such as temperature defined as a fixed requirement, a measurement read from a sensor, or a measurement leveraged from a virtual sensor reading, in accordance with embodiments of the present disclosure.

FIG. 6 illustrates a user interface for setting cooling airflow to meet defined conditions, such as temperature defined as a fixed requirement, a measurement read from a sensor, or a measurement leveraged from a virtual sensor reading, in accordance with embodiments of the present disclosure. The user interface of FIG. 6 may be used by thermal manager 42 to compute how much airflow is required to cool a component. The temperature and power values may be static or dynamic; however, one value may be set to static to support control of the other values to meet a targeted static condition. An airflow energy balance table 60 may support mass airflow and exhaust temperature estimates with dynamic or static settings in the power consumption of the components. An average number of readings input aids in adjusting for thermal lag related to delays between dissipation of power by components and temperature impacts. In the entry for energy balance number EB4 shown in FIG. 6, an exhaust temperature of 70° C. may be set for exhaust from a PCI card based upon a static power setting for a lane width of eight lanes. For example, a lane width of eight lanes may define an estimated power consumption for the card and the 70° C. temperature may define an overall system safety constraint. The entry sets a static inlet temperature for the PCI card of 55° C., such as might be an input limit for the PCI card or so that an airflow rate is determined that maintains the desired exhaust temperature constraint. Alternatively, the inlet temperature may be dynamic from a physical sensor or from a virtual sensor computed with a conservation of energy estimated based upon upstream component power consumption. If the airflow rate is less than another airflow rate required at a different location in housing 12, the constraint may be met without applying the determined airflow rate. For example, if the airflow rate to maintain 55° C. exhaust from the CPUs is greater than the airflow rate required to maintain PCI card thermal conditions, then the CPU airflow rate will apply. In this manner, discrete airflow rates for different portions of information handling system 10 may provide more exact thermal management for components disposed within housing 12.

FIG. 7 illustrates a user interface table 62 for conversion of determined airflow rates to cooling fan pulse width modulation (PWM) settings, in accordance with embodiments of the present disclosure. For example, a graph of different levels of cooling airflow and PWM settings is depicted for different numbers of hard disk drives disposed in housing 12. Such data may be used to set a scaling factor (value of 0.008 under the heading "HDD") in an energy balance entry for a particular energy balance number. Thus, given a particular airflow requirement, whether in CFM or LFM, required cooling fan speeds may be calculated based upon system configuration as detected by BMC 38.

Using the foregoing methods and systems, a cubic airflow rate or linear airflow velocity at a particular point (e.g., at an inlet of PCI subsystem 32) in information handling system 10, may be estimated based on cooling fan speed. Such cubic airflow rate or linear airflow rate may be a "bulk" or average value (e.g., a per PCI slot average value) or a worst case rate (e.g., a value for a "worst case" PCI slot PCI subsystem 32). In addition, using the foregoing methods and systems, given a required cubic airflow rate or linear airflow velocity for a component (e.g., a PCI card), a minimum fan speed required to support such component may be estimated.

While the foregoing description contemplates using energy balances to estimate a linear airflow velocity in LFM based on a cooling fan PWM value, linear airflow velocity in LFM may also be estimated by using an estimate of cubic airflow rate in CFM (e.g., generated using energy balance data from table 52 in FIG. 5) and an estimated cross-sectional area through which the flow of air travels.

FIG. 8 illustrates a perspective view of an example liquid cooling adapter 33, in accordance with embodiments of the present disclosure. As shown in FIG. 8, liquid cooling adapter 33 may include inlet conduit 82, outlet conduit 84, sensors 86 and 88, field-replaceable unit (FRU) 90, controller 92, leak detector 94, sideband interface 96, and external connection 98.

Inlet conduit 82 may be a fluidic conduit configured to receive cooled refrigerant liquid from a cooling distribution unit (not shown) external to liquid cooling adapter 33. Similarly, outlet conduit 84 may be a fluidic conduit configured to return heated refrigerant liquid to the cooling distribution unit such that the refrigerant liquid may cool the liquid before it is returned via inlet conduit 82.

Sensors 86 and 88 may each include any suitable sensor configured to sense a physical quantity (e.g., temperature, pressure, flow rate, etc.) of refrigerant liquid within inlet conduit 82 and outlet conduit 84, respectively.

FRU 90 may include any suitable computer-readable medium for storing information regarding liquid cooling adapter 33. For example, FRU 90 may store thermal control and/or power settings customized to the particular liquid cooling adapter 33. In addition or alternatively, FRU 90 may simply store configuration information indicating that liquid cooling adapter 33 is an adapter used in connection with a liquid cooling solution.

Controller 92 may comprise any suitable system, device, or apparatus configured to control components of liquid cooling adapter 33. For example, controller 92 may provide for power and/or control of a pump (e.g., externally coupled to liquid cooling adapter 33 via external connection 98) for refrigerant liquid.

Leak detector 94 may comprise any suitable system, device, or apparatus configured to detect a refrigerant leak in a liquid cooling system, including leaks from inlet conduit 82 or outlet conduit 84.

Sideband interface 96 may comprise any suitable system, device, or apparatus configured to serve as a communications interface between the various components of liquid cooling adapter 33 (e.g., sensors 86 and 88, FRU 90, controller 92, leak detector 94, and/or external connection 98) allowing information to be transmitted from the components of liquid cooling adapter 33 to BMC 38 (e.g., via chipset 36). For example, in some embodiments, sideband interface 96 may comprise an Inter-Integrated Circuit (I2C) interface for communication of data between liquid cooling adapter 33 and BMC 38.

Accordingly, in operation, information regarding liquid cooling adapter 33 stored in FRU 90 may be communicated via sideband interface 96 to BMC 38 such that thermal manager 42 may use such information in order to provide thermal control of information handling system 10. For example, if the information communicated from FRU 90 indicates presence of a liquid cooling adapter, the thermal table information depicted in FIGS. 4-6 above may include an entry having thermal parameters for a configuration of information handling system 10 with liquid cooling, and thus may use such thermal parameters in thermally controlling information handling system 10. In these and other embodiments, the information communicated from FRU 90 may include actual thermal parameters to be used in the thermal table information depicted in FIGS. 4-6. As a particular example, the information communicated from FRU 90 may include an exhaust temperature $T_{EXHAUST}$ limit and an ambient temperature $T_{INLET}$ limit for airflow energy balance table 60. Other examples of thermal parameters that may be communicated from FRU for thermal control by thermal manager 42 may include power capping thresholds for components of information handling system 10, disabling of closed-loop control for components of information handling system 10, or any other suitable parameters.

In these and other embodiments, a presence of a leak detected by leak detector 94 may be communicated via sideband interface 96 to BMC 38, so that BMC 38 may take remedial action (e.g., system shutdown) and/or generate alerts to a user indicative of the presence of the leak.

In these and other embodiments, telemetry information (e.g., temperature, pressure, flow rate, etc.) regarding refrigerant fluid may be communicated from sensors 86 and/or 88, thus allowing for reporting and/or use of such telemetry information for thermal control of information handling system 10.

In these and other embodiments, information may be communicated between controller 92 and BMC 38 for monitoring and control of a pump for driving refrigerant liquid in conduits 82 and 84.

Although the foregoing discusses cubic airflow in terms of cubic feet per minute, other units of measurement may be used (e.g., cubic meters per second). Also, although the foregoing discusses linear airflow velocity in terms of linear feet per minute, other units of measurement may be used (e.g., meters per second).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:
   a plurality of information handling resources including a thermal manager; and
   a liquid cooling adapter comprising:
      fluidic conduits for conveying a refrigerant liquid between a cooling distribution unit external to the information handling system and at least one of the plurality of information handling resources;
      a computer-readable medium configured to store information regarding the liquid cooling adapter; and
      a sideband interface communicatively coupled between the computer-readable medium and the thermal manager such that the thermal manager is configured to receive the information regarding the liquid cooling adapter from the computer-readable medium and provide thermal control of the information handling system in accordance with the information regarding the liquid cooling adapter.

2. The information handling system of claim 1, wherein the computer-readable medium comprises a field-replaceable unit.

3. The information handling system of claim 1, wherein the information regarding the liquid cooling adapter comprises information indicating that the liquid cooling adapter is adapted for use with liquid cooling.

4. The information handling system of claim 1, wherein the information regarding the liquid cooling adapter comprises thermal parameters to be applied by the thermal manager during thermal control of the information handling system.

5. The information handling system of claim 4, the thermal parameters including one or more temperature limits of the information handling system to be applied on account of the liquid cooling adapter.

6. The information handling system of claim 4, the thermal parameters including one or more power capping limits of the information handling system to be applied on account of the liquid cooling adapter.

7. The information handling system of claim 4, the thermal parameters including one or more loop control parameters of the information handling system to be applied on account of the liquid cooling adapter.

8. The information handling system of claim 1, wherein the liquid cooling adapter further comprises a leak detector configured to detect for a presence of a refrigerant liquid leak, such that one of the plurality of information handling resources is configured to receive from the leak detector via the sideband interface an indication of the presence of the leak and take action in response to the presence of the leak.

9. The information handling system of claim 1, wherein the liquid cooling adapter further comprises one or more sensors for measuring one or more physical quantities associated with the refrigerant liquid, such that one of the plurality of information handling resources is configured to receive from the one or more sensors via the sideband interface one or more signals indicative of the physical quantities.

10. The information handling system of claim 1, wherein the liquid cooling adapter further comprises a controller for monitoring or controlling a pump for driving the refrigerant liquid, such that one of the plurality of information handling resources is configured to communicate with the controller via the sideband interface one or more signals indicative of controlling or monitoring of the pump.

11. A liquid cooling adapter comprising:
   fluidic conduits for conveying a refrigerant liquid between a cooling distribution unit external to an information handling system comprising the liquid cooling adapter and at least one information handling resource of the information handling system;
   a computer-readable medium configured to store information regarding the liquid cooling adapter; and
   a sideband interface configured to be communicatively coupled between the computer-readable medium and a thermal manager of the information handling system such that the thermal manager receives the information regarding the liquid cooling adapter from the computer-readable medium and provides thermal control of the information handling system in accordance with the information regarding the liquid cooling adapter.

12. The liquid cooling adapter of claim 11, wherein the sideband interface is an Inter-Integrated Circuit (I2C) interface.

13. The liquid cooling adapter of claim 11, wherein the information regarding the liquid cooling adapter comprises information indicating that the liquid cooling adapter is adapted for use with liquid cooling.

14. The liquid cooling adapter of claim 11, wherein the information regarding the liquid cooling adapter comprises thermal parameters to be applied by the thermal manager during thermal control of the information handling system.

15. The liquid cooling adapter of claim 14, the thermal parameters including one or more temperature limits of the information handling system to be applied on account of the liquid cooling adapter.

16. The liquid cooling adapter of claim 14, the thermal parameters including one or more power capping limits of the information handling system to be applied on account of the liquid cooling adapter.

17. The liquid cooling adapter of claim 14, the thermal parameters including one or more loop control parameters of the information handling system to be applied on account of the liquid cooling adapter.

18. The liquid cooling adapter of claim 11, wherein the liquid cooling adapter further comprises a leak detector configured to detect for a presence of a refrigerant liquid leak, such that one of the at least one information handling resource is configured to receive from the leak detector via the sideband interface an indication of the presence of the leak and take action in response to the presence of the leak.

19. The liquid cooling adapter of claim 11, wherein the liquid cooling adapter further comprises one or more sensors for measuring one or more physical quantities associated with the refrigerant liquid, such that one of the at least one information handling resource is configured to receive from the one or more sensors via the sideband interface one or more signals indicative of the physical quantities.

20. The liquid cooling adapter of claim 11, wherein the liquid cooling adapter further comprises a controller for monitoring or controlling a pump for driving the refrigerant liquid, such that one of the at least one information handling resource is configured to communicate with the controller via the sideband interface one or more signals indicative of controlling or monitoring of the pump.

* * * * *